(12) United States Patent
Chandrasekaran

(10) Patent No.: US 6,765,440 B2
(45) Date of Patent: Jul. 20, 2004

(54) MODEL-BASED FEED-FORWARD LINEARIZATION OF AMPLIFIERS

(75) Inventor: Rajiv Chandrasekaran, Basking Ridge, NJ (US)

(73) Assignee: Andrew Corporation, Orland Park, IL (US)

(*) Notice: Subject to any disclaimer, the term of this patent is extended or adjusted under 35 U.S.C. 154(b) by 0 days.

(21) Appl. No.: 10/322,953

(22) Filed: Dec. 18, 2002

(65) Prior Publication Data

US 2004/0119534 A1 Jun. 24, 2004

(51) Int. Cl.[7] .............................. H03F 1/26; H03F 1/30
(52) U.S. Cl. ...................................... 330/149; 330/151
(58) Field of Search .................................. 330/149, 151

(56) References Cited

U.S. PATENT DOCUMENTS

| | | | |
|---|---|---|---|
| 5,963,091 A | 10/1999 | Chen et al. ................. | 330/151 |
| 6,154,093 A | 11/2000 | Chen et al. ................. | 330/151 |
| 6,166,601 A | 12/2000 | Shalom et al. .............. | 330/151 |
| 6,166,603 A | 12/2000 | Smith .......................... | 330/263 |
| 6,172,565 B1 | 1/2001 | Chen et al. ................. | 330/151 |
| 6,236,267 B1 | 5/2001 | Anzil .......................... | 330/149 |
| 6,281,747 B2 | 8/2001 | Ahuja et al. ................ | 330/109 |
| 6,288,610 B1 | 9/2001 | Miyashita ................... | 330/149 |
| 6,366,177 B1 | 4/2002 | McCune et al. ........... | 330/103 |
| 6,417,731 B1 | 7/2002 | Funada et al. .............. | 330/149 |
| 2002/0012404 A1 | 1/2002 | Ahn ........................... | 375/297 |
| 2002/0047746 A1 | 4/2002 | Dartois ....................... | 330/151 |
| 2002/0089374 A1 | 7/2002 | McRory ...................... | 330/149 |
| 2002/0105379 A1 | 8/2002 | Nakayama et al. ......... | 330/151 |
| 2003/0184373 A1 * | 10/2003 | Cameron et al. ........... | 330/149 |

FOREIGN PATENT DOCUMENTS

JP          05121957       * 5/1993

OTHER PUBLICATIONS

Provisional Application # 60/356,872.*

* cited by examiner

*Primary Examiner*—Michael B. Shingleton
(74) *Attorney, Agent, or Firm*—Steve Mendelsohn

(57) ABSTRACT

The signal generated by a high-power amplifier (HPA) operating in its non-linear region is linearized by an amplifier circuit using feed-forward compensation in which an auxiliary channel relies on a model of the HPA to generate an auxiliary signal that is combined with the HPA output to generate an amplified linearized output signal. The amplifier circuit may be implemented with a pre-distorter in the main amplifier channel to linearize the HPA using both pre-compensation and feed-forward compensation. Using the HPA model in the auxiliary channel enables the auxiliary signal to be generated without directly relying on the HPA output. This enables the amplifier circuit to be implemented without having to delay the high-power HPA output signal prior to being synchronously combined with the auxiliary signal. In preferred embodiments, the auxiliary channel signal is generated using a relatively low-power amplifier operating in its linear region.

44 Claims, 3 Drawing Sheets

MODEL-BASED FEED-FORWARD LINEARIZATION OF AMPLIFIERS

FIELD OF THE INVENTION

The present invention relates to signal processing, and, in particular, to techniques for linearizing amplifiers used in communications systems using feed-forward compensation.

BACKGROUND OF THE INVENTION

Amplifiers, such as high-power amplifiers used in the base stations of wireless communication systems, typically exhibit non-linearity over their operating ranges. This non-linearity can result in noise that can corrupt or otherwise interfere with the communications. To address this problem, additional circuitry may be added to an amplifier in an attempt to linearize the effective amplifier response. Conventional techniques for linearizing amplifiers typically involve pre-compensation and/or feed-forward compensation.

In amplifier linearization based on pre-compensation, the input signal that is to be amplified is pre-distorted prior to being applied to the amplifier in order to adjust the input signal based on known non-linearities in the amplifier transfer function. The pre-distortion module is typically controlled using a feed-back signal based on the output signal generated by the amplifier. In feed-forward compensation, an auxiliary signal is fed forward and combined with the output of the amplifier to adjust the output signal for non-linearities in the amplifier transfer function.

FIG. 1 shows a high-level block diagram of a linearized amplifier circuit 100 according to the prior art. Amplifier circuit 100 utilizes both pre-compensation and feed-forward compensation to linearize the response of a high-power amplifier (HPA) 104. Amplifier circuit 100 has a main signal processing channel and an auxiliary signal processing channel. The main channel includes pre-distorter 102, HPA 104, and high-power delay module 106, while the auxiliary channel includes delay module 110, summation node 114, and low-power amplifier (LPA) 116. In addition, amplifier circuit 100 includes summation node 108.

The input signal is applied to both pre-distorter 102 and delay module 110. Pre-distorter 102 pre-distorts (i.e., pre-compensates) the input signal prior to being applied to HPA 104. The output from HPA 104 is applied to high-power delay module 106 and coupled off at node 112. Summation node 114 subtracts the delayed input signal of delay module 110 from the attenuated amplifier signal from node 112 to generate the input to LPA 116. Summation node 108 subtracts the output of LPA 116 from the delayed output of HPA 104 to generate the linearized output signal.

Although not shown in FIG. 1, amplifier circuit 100 would also typically have a third ("feed-back control") channel in which control signals are generated based on output signals from one or more of the various components (e.g., pre-distorter 102, HPA 104, summation node 114, and/or LPA 116) and used to control the operations of different components, such as pre-distorter 102 and/or LPA 116.

The purpose of delay modules 106 and 110 is to ensure synchronization between the pairs of signals combined at summation nodes 108 and 114, respectively. In particular, delay module 110 delays the input signal to account for the processing time of pre-distorter 102 and HPA 104, while high-power delay module 106 delays the high-power output of HPA 104 to account for the processing time of summation node 114 and LPA 116. These delays become more and more undesirable as the speed of data communications increases.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Generic Embodiment

Figure 1:
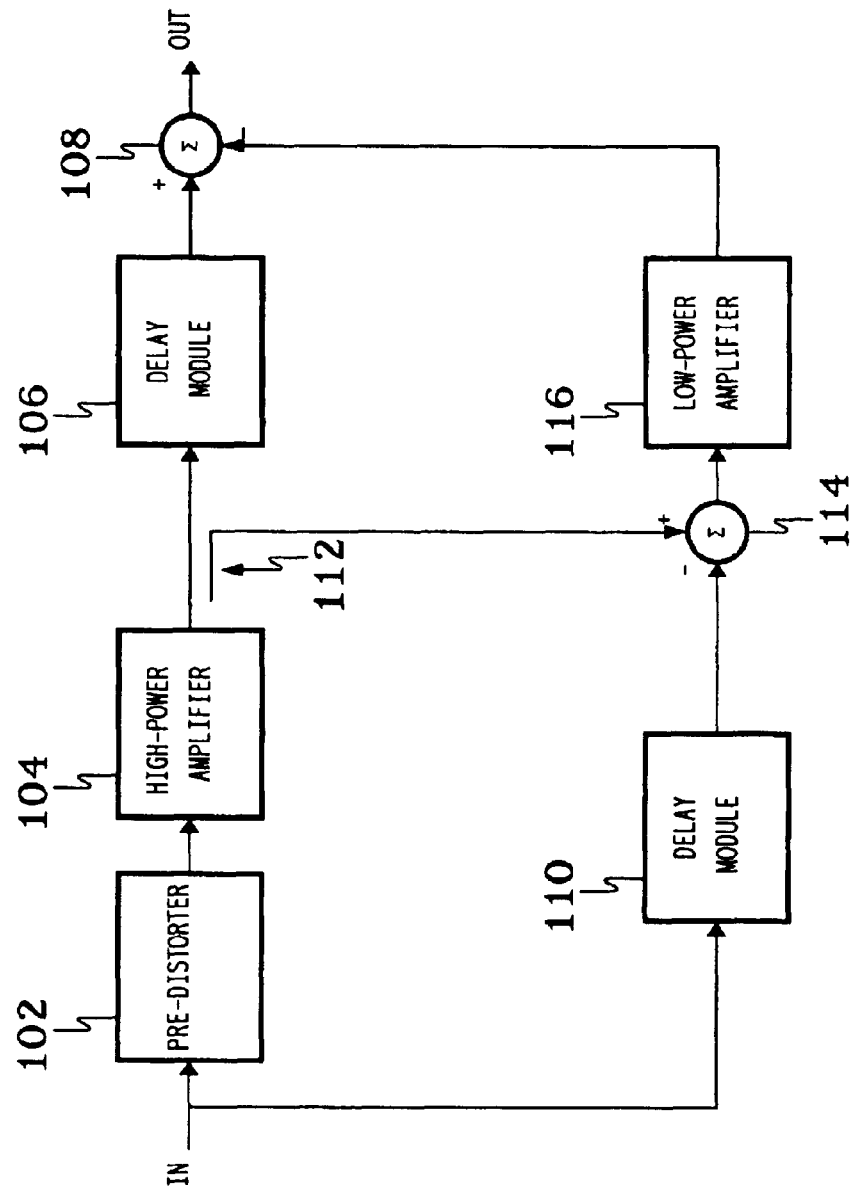
FIG. 1 is a high-level block diagram of a linearized amplifier circuit of the prior art.
Figure 2:
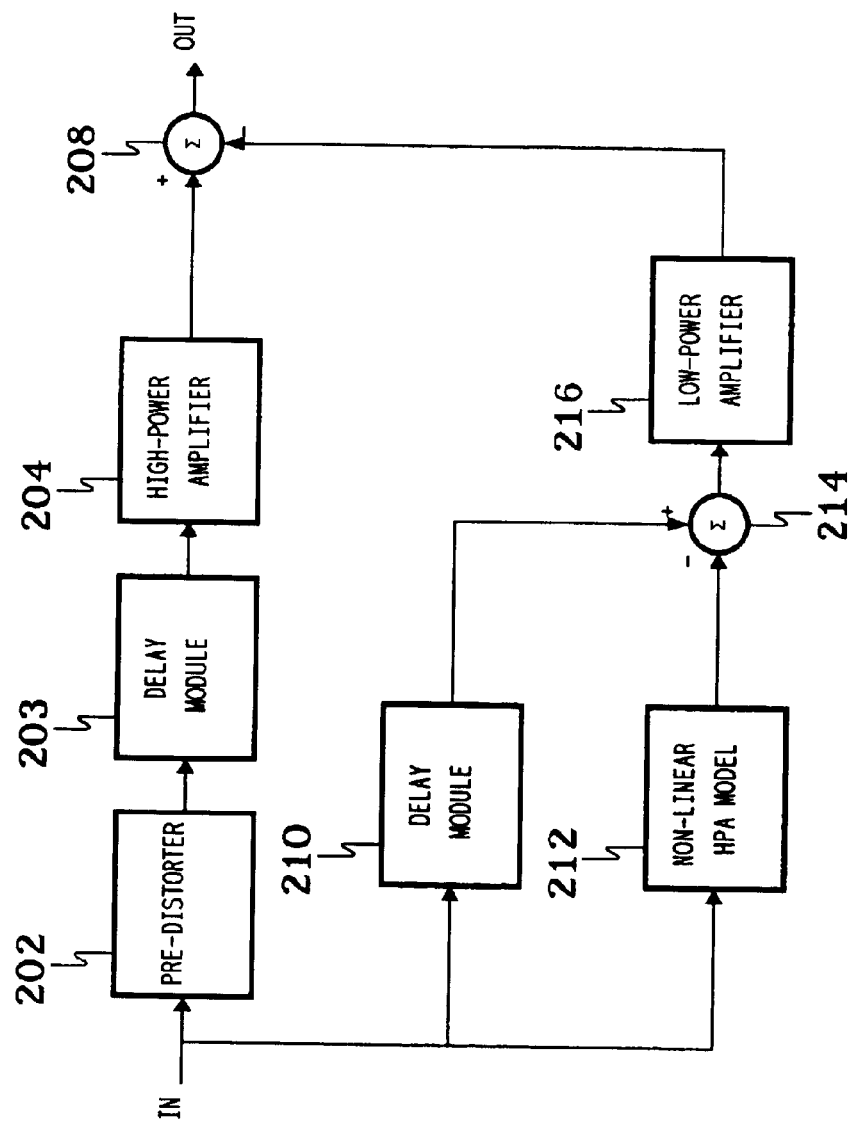
FIG. 2 shows a high-level block diagram of a linearized amplifier circuit of the present invention.

FIG. 2 shows a high-level block diagram of a linearized amplifier circuit 200 of the present invention. Like prior-art amplifier circuit 100 of FIG. 1, amplifier circuit 200 utilizes both pre-compensation and feed-forward compensation to linearize the response of a high-power amplifier 204. Amplifier circuit 200 has a main signal processing channel and an auxiliary signal processing channel. The main channel includes pre-distorter 202, delay module 203, and HPA 204, while the auxiliary channel includes non-linear HPA model block 212, summation node 214, and low-power amplifier 216. In addition, amplifier circuit 200 includes delay module 210 and summation node 208.

The input signal is applied to pre-distorter 202, delay module 210, and HPA model 212. Pre-distorter 202 pre-distorts (i.e., pre-compensates) the input signal prior to being applied to HPA 204 via delay module 203. HPA model 212 provides a model of the distortion of HPA 204. In particular, HPA model 212 processes the input signal based on a model of the non-linearities of HPA 204. Summation node 214 subtracts the filtered input signal from HPA model 212 from the delayed input signal from delay module 210 to generate an error signal that represents the amplifier distortion and which is applied to low-power amplifier 216. Summation node 208 subtracts the output of LPA 216 from the output of HPA 104 to generate the linearized output signal.

Although not shown in FIG. 2, amplifier circuit 200 would also typically have a third ("feed-back control") channel in which control signals are generated based on output signals from one or more of the various components (e.g., pre-distorter 202, HPA 204, summation node 214, and/or LPA 216) and used to control the operations of different components, such as pre-distorter 202, HPA model 212, and/or LPA 216.

Low-power delay modules 203 and 210 ensure synchronization between the pairs of signals combined at summations nodes 208 and 214, respectively. In particular, delay module 210 delays the input signal to account for the processing time of HPA model 212, while delay module 203 delays the input to HPA 104 to account for differences in processing time between the main and auxiliary channels.

One difference between the architecture of amplifier circuit 200 of the present invention and prior art amplifier circuit 100 of FIG. 1 is that, in amplifier circuit 200, the error signal in the auxiliary channel is generated using HPA model 212, while, in amplifier circuit 100, the error signal in the auxiliary channel is generated using the actual output from HPA 104. As a result, in amplifier circuit 200, a high-power delay module similar to high-power delay module 106 of amplifier circuit 100 is not needed to delay the output from HPA 204 in order to synchronize the inputs to summation node 208. Furthermore, the overall delay from input to output in amplifier circuit 200 can be reduced relative to the overall delay of prior art amplifier circuit 100.

By careful design of the various components in the main and auxiliary channels, the overall processing time of pre-distorter 202 and HPA 204 in the main channel can be the same as the overall processing time of the auxiliary channel. In this case, delay module 203 can be eliminated. Even if some delay is needed to synchronize the main and auxiliary channel signals, such delay will still be smaller than the overall delay associated with prior art amplifier circuit 100 and such delay does not need to be applied to a high-power signal as in amplifier circuit 100.

RF Embodiment

Figure 3:
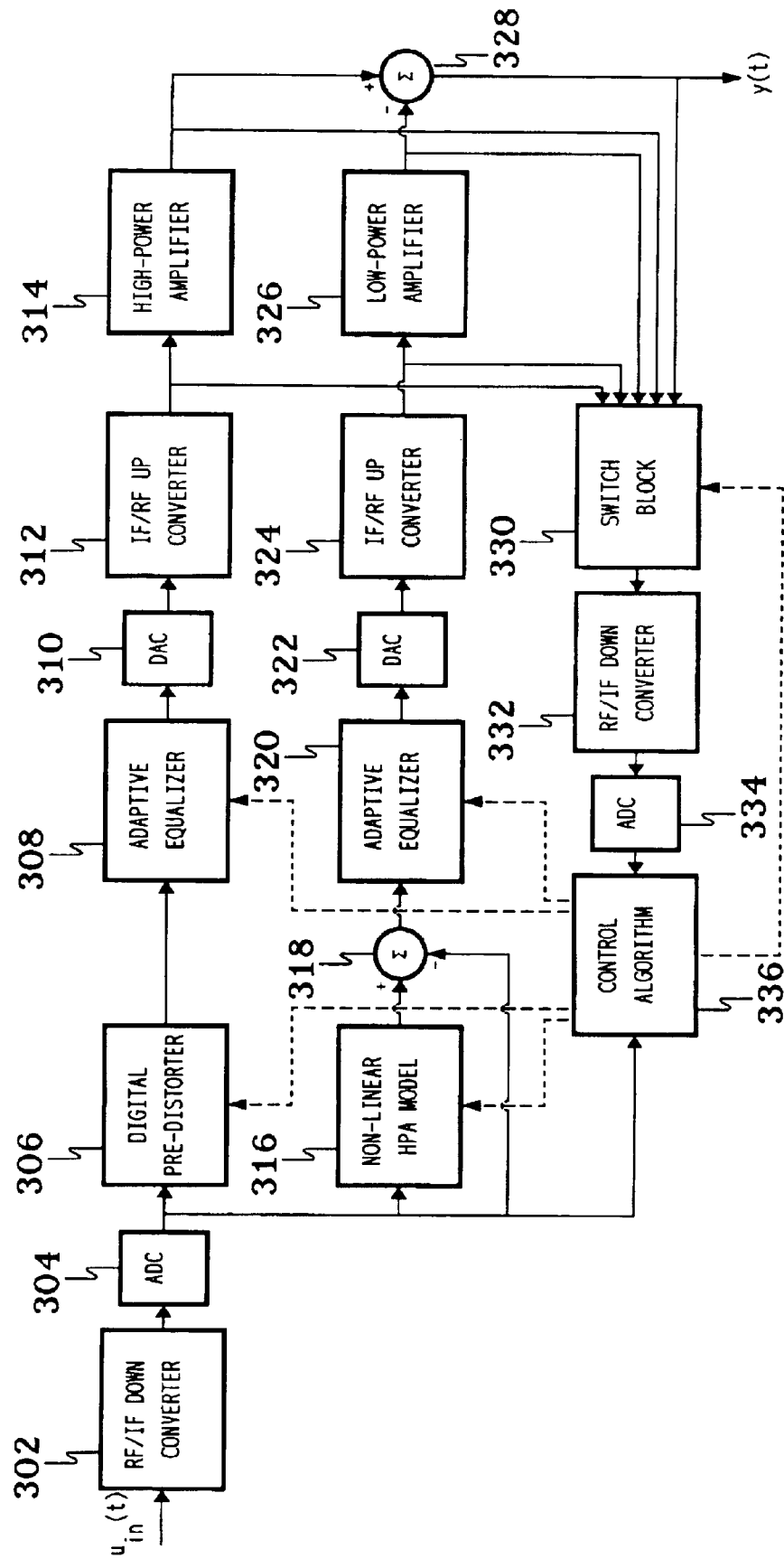
FIG. 3 is a block diagram of a linearized amplifier circuit, according to one embodiment of the present invention.

FIG. 3 shows a block diagram of a linearized amplifier circuit 300, according to one embodiment of the present invention that amplifies a radio frequency (RF) input signal. Amplifier circuit 300 has three signal processing channels: a main channel, an auxiliary channel, and a feed-back control channel. In particular, amplifier circuit 300 receives an analog RF input signal for (optional) pre-compensation and amplification by the main signal processing channel. The auxiliary channel generates an auxiliary signal that is fed forward and combined with the output of the main channel to generate a linearized output signal for the circuit. The feed-back control channel generates control signals that are used to control operations of various components in the main and auxiliary channels.

More particularly, the main channel includes digital pre-distorter 306, adaptive equalizer 308, digital-to-analog converter (DAC) 310, IF/RF (intermediate frequency to radio frequency) up converter 312, and non-linear high-power amplifier 314. The auxiliary channel includes non-linear HPA model block 316, summation node 318, adaptive equalizer 320, DAC 322, IF/RF up converter 324, and low-power amplifier 326. The control feed-back channel includes switch block 330, RF/IF down converter 332, analog-to-digital converter (ADC) 334, and control algorithm block 336. In addition, amplifier circuit 300 includes RF/IF down converter 302, ADC 304, and summation node 328.

In operation, a composite analog RF input signal $u_{in}(t)$ located within the operating bandwidth of amplifier circuit 300 is fed to RF/IF down converter 302, which converts and centers the RF input signal at an appropriate intermediate frequency as analog IF signal $y_{if}(t)$. ADC 304 samples and quantizes IF signal $y_{if}(t)$ to produce discrete time signal $y_{adc}(n)$, copies of which are applied to digital pre-distorter 306, HPA model 316, summation node 318 (via a delay module (not shown) analogous to delay module 210 in FIG. 2), and control algorithm 336.

In the main channel, digital pre-distorter 306 pre-distorts (i.e., pre-compensates) digital signal $y_{adc}(n)$ to generate pre-distorted signal $y_{pre}(n)$. Pre-distorter 306, which is an optional component, is preferably implemented using a combination of look-up tables (LUTs) and filters, which can be periodically updated via the control feed-back channel.

The pre-distorted signal $y_{pre}(n)$ is then processed by adaptive equalization filter block 308 to compensate for variation in amplitude and phase in the main channel. Equalizer 308 also compensates for differences between the main and auxiliary channels. The resulting equalized signal $y_{eq}(n)$ is converted by DAC 310 into an analog IF signal $y_{dac}(t)$. IF/RF up converter 312 converts the IF signal $y_{dac}(t)$ into an RF signal $y_{up}(t)$ for input to and amplification by non-linear HPA 314, which produces amplified signal $y_{ti}(t)$. In a preferred implementation, equalizer 308 generates control signals for controlling the gain of HPA 314.

In the auxiliary channel, digital signal $y_{adc}(n)$ is fed to HPA model 316, which produces a digital signal $y_{ffnl}(n)$. A system identification algorithm that resides in control algorithm block 336 adapts this non-linear model to generate an accurate representation of the main channel of amplifier circuit 300. The model input signal $y_{adc}(n)$ is subtracted from the model output signal $y_{ffnl}(n)$ at summation node 318 to generate an error signal $y_{fferr}(n)$ containing information about the amplifier distortion. This distortion signal $y_{fferr}(n)$ is processed by adaptive equalizer 320, where amplitude and phase variations in the auxiliary channel are equalized. Similar to the main channel, the equalized signal $y_{ffeq}(n)$ is converted to an analog IF signal $y_{ffdac}(t)$ by DAC 322 and converted to an RF signal $Y_{ffup}(t)$ by IF/RF up converter 324. Since the power of the distortion signal is typically low relative to the power of the input signal, the output $y_{ffup}(t)$ of up converter 324 is amplified by a low-power amplifier 326 operating within its linear region. The resulting linearly amplified $y_{err}(t)$ is subtracted from the main channel output signal $y_{ti}(t)$ by summation node 328 to produce the linearized output signal y(t) for amplifier circuit 300. In a preferred implementation, equalizer 320 generates control signals for controlling the gain of LPA 326.

The feed-back control channel receives five inputs: $y_{up}(t)$ from up converter 312, $y_{ti}(t)$ from non-linear HPA 314, $y_{ffup}(t)$ from up converter 324, $y_{err}(t)$ from LPA 326, and y(t) from summation node 328. Digitally controlled switch block 330 determines which of these five signals is used in the feed-back control channel. A combination of one or more of these signals is used for the system identification algorithm, pre-distorter computation, and/or equalization.

In particular, RF/IF down converter 332 converts the RF signals to IF and ADC 334 digitizes the resulting IF signals for application to control algorithm block 336. The control algorithm computes (a) parameters for digital pre-distorter 306 and HPA model 316 and (b) coefficients for equalizers 308 and 320. Additionally, the control algorithm is preferably able to perform system calibration, power management, and other support features.

The architecture shown in FIG. 3 assumes that the overall processing time of the main channel is the same as the overall processing time of the auxiliary channel. This can be achieved by careful design of the various components in those channels. Processing time differences can also be compensated for using equalizers 308 and 320. Even if some delay is needed to synchronize the channel signals, such delay will still be smaller than the overall delay associated with prior art amplifier circuit 100 and such delay does not need to be applied to a high-power signal as in amplifier circuit 100.

Further information on some of these different components is provided in the following sections.

Pre-distorter

Digital pre-distorter 306 of amplifier circuit 300 is an optional component. When pre-distorter 306 is included in the architecture, the amplifier circuit of FIG. 3 linearizes HPA 314 using both pre-compensation and feed-forward compensation. When excluded, the amplifier circuit uses only feed-forward compensation.

The implementation of pre-distorter 306 preferably involves adaptively updating look-up tables and filters. The pre-distortion linearization scheme would involve an adaptively updated function $G(y_{adc}(n))$ that operates on the input signal in such a way that the complex-valued pre-compensated signal $y_{pre}(n)$ is distorted in a precisely complementary manner to the non-linear AM-AM, AM-PM, and other frequency-dependent distortion produced by HPA 314. Such pre-distortion linearization schemes are described in U.S. patent application Ser. No. 10/245,008, filed on Sep. 17, 2002 ("the '008 application"), the teachings of which are incorporated herein by reference.

Equalizers

Equalizers 308 and 320 of amplifier circuit 300 are designed to equalize any phase and amplitude differences between the auxiliary and main channels that arise due to unpredictable component variations. In addition to equalizing phase and magnitude, the equalizers can also be implemented to automatically compensate for delay imbalances between the main and auxiliary channels to properly align (i.e., synchronize) the signals applied to summation node 328. These equalizers are preferably implemented with finite impulse response (FIR) filters with coefficients that can be updated by control algorithm block 336.

In particular, adaptive equalizer 308 is preferably designed to compensate for the frequency response (amplitude and group-delay variations) of the main channel up-conversion path that includes DAC 310 and IF/RF up converter 312. Equalizer 308 is designed such that the input $y_{up}(t)$ to HPA 314 is a delayed version of the output $y_{pre}(n)$ from pre-distortion block 306.

The equalizer coefficients may be computed by the method of least squares. Assume that switch block 330 is set to sample the output of IF/RF up converter 312, so that the output of the feed-back channel ADC 334 is a sampled version of the output $y_{up}(n)$ of up converter 312. The equalization problem can now be described as follows: Compute a set of filter coefficients such that $y_{up}(n)=y_{pre}(n-d)$, where d is an arbitrary delay.

If the impulse response of equalizer 308 is denoted by $h(n)$ and the impulse response of the up-conversion (i.e., DAC 310+up converter 312) is denoted by $g(n)$, then, according to Equation (1):

$$y_{up}(n)=y_{pre}(n-d)=y_{pre}(n)*h(n)*g(n) \quad (1)$$

where "*" denotes the convolution operator. Therefore, the optimum equalizer satisfies Equation (2) as follows:

$$h(n)*g(n)=\delta(n-d) \quad (2)$$

Combining Equations (1) and (2) yields Equation (3) as follows:

$$y_{up}(n)*h(n)=y_{pre}(n)*h(n)*g(n)*h(n)=v(n-d) \quad (3)$$

where $v(n)=y_{pre}(n)*h(n)$.

Equation (3) may be used to determine the coefficients of equalizer 308. Assume that the equalizer is implemented as an FIR filter of length $N_{eq}$ and that the equalizer coefficients are represented in a column vector $h(n)$ as $[h(1)\ h(2)\ \ldots\ h(N_{eq})]^T$. The steps for computing the equalizer coefficients are:

(1) Capture N samples of $v(n)$ and $y_{up}(n)$.
(2) Construct the convolution matrix $Y_{up}(n)$ of Equation (4) as follows:

$$Y_{up}(n) = \begin{pmatrix} y_{up}(1) & 0 & \cdots & 0 \\ y_{up}(2) & y_{up}(1) & 0 & \cdots \\ \vdots & \vdots & \ddots & \vdots \\ y_{up}(N) & y_{up}(N-1) & \cdots & y_{up}(N-N_{eq}+1) \end{pmatrix}_{N \times N_{eq}} \quad (4)$$

and the delay vector $v(n-d)$ of Equation (5) as follows:

$$v(n-d) = \begin{pmatrix} 0_{d,1} \\ v(1) \\ \vdots \\ v(N-d) \end{pmatrix}_{N \times 1} \quad (5)$$

(3) Solve for the equalizer coefficients by minimizing the cost function $C_h$ of the following Equation (6):

$$C_h=\|Y_{up}(n)h(n)-v(n-d)\|^2. \quad (6)$$

The solution is obtained by setting $$\frac{\partial C_h}{\partial h(n)} = 0,$$

which yields Equation (7) as follows:

$$h(n)=(Y_{up}^H(n)Y_{up}(n))^{-1}Y_{up}^H(n)v(n-d), \quad (7)$$

where $Y_{up}^H(n)$ is the conjugate transpose of the convolution matrix $Y_{up}(n)$. Equalizer 308 uses the computed coefficients to equalize the pre-distorted signal $y_{pre}(n)$.

The method described above can also be used to determine the coefficients for the auxiliary channel equalizer 320, such that the input to LPA 326 will be a delayed replica of the error signal generated at summation node 318.

Non-linear HPA Model

Non-linear HPA model 316 is used to form an accurate model of HPA 314 based on parameters updated periodically by an adaptive system identification algorithm that relies on least mean squares (LMS) or recursive least squares (RLS) techniques. The input signal is subtracted from the output of HPA model 316 to generate an error signal that will contain an estimate of the amplifier distortion. The distortion introduced by HPA 314 is assumed to be low power relative to the distortion-free input RF signal. HPA model 316 may be implemented by a digital signal processor (DSP). When the HPA model is implemented digitally, the number and type of adjustable parameters can be increased to achieve increasingly greater accuracy and improved linearity performance. In alternative embodiments, HPA model 316 may be implemented in hardware using analog components. In a preferred embodiment, HPA model 316 is generated and implemented using the methods described in the '008 application.

Low-power Amplifier

Since the signal in the auxiliary channel is relatively low in power, LPA 326 of amplifier circuit 300 amplifies the input signal while operating in its linear region. Ideally, the output signal from LPA 326 is an exact amplified replica of the input signal applied to LPA 326, i.e., $y_{err}(t)=Ky_{ffup}(t)$, where K is the gain of the LPA that is constant over the operating region.

Control Algorithm

In a preferred embodiment, control algorithm 336 performs the following steps:

(1) Set switch box 330 to capture the output $y_{up}(t)$ of the main channel up converter 312 synchronously with $y_{pre}(n)$. Compute the equalizer coefficients for the main channel from $y_{pre}(n)$ and $y_{up}(t)$ using the method described previously in the section entitled "Equalizer."

(2) Set switch box 330 to capture the output $y_{ffup}(t)$ of the auxiliary channel up converter 324 synchronously with $y_{fferr}(n)$. Compute the equalizer coefficients for the auxiliary channel from $y_{fferr}(n)$ and $y_{ffup}(t)$ using the method described previously in the section entitled "Equalizer."

(3) Set switch box 330 to capture the output $y_{til}(t)$ of HPA 314. Compute an amplifier model from $u_{in}(t)$ and $y_{til}(t)$ using the technique described in the '008 application.

(4) Load the parameters for the amplifier model into HPA model 316 and generate the error signal output by summation block 318.

(5) Adjust the delay, gain, and phase of equalizer 320 to synchronously cancel the distortion from HPA 314 by subtracting the up-converted error signal $y_{err}(t)$ from $y_{til}(t)$.

(6) Repeat steps (1)–(5), if desired, to continuously adapt amplifier circuit 300 for optimal performance.

Alternative Embodiments

Although FIG. 2 shows summation node 214 subtracting the input signal from the output of HPA model 212 and summation node 208 subtracting the output signal from LPA 216 from the output signal from HPA 204, those skilled in the art will understand that an amplifier circuit could also be implemented with these subtractions reversed. The same alternative applies to the subtractions at summation nodes 318 and 328 in the amplifier circuit of FIG. 3.

The present invention has been described in the context of amplifier circuit 300 of FIG. 3, in which an analog RF input signal is amplified, but where the input signal is down-converted to an intermediate frequency and digitized for optional pre-compensation and feed-forward compensation processing. The present invention is not limited to such an embodiment for such an application. In other applications, the present invention may be applied to amplify input signals other than analog RF signals, such as analog signals at other frequencies and/or digital signals. For example, a digital input signal could be processed to generate an amplified analog output signal. In addition, in other embodiments, the optional pre-compensation and/or feed-forward compensation processing may be implemented at frequencies other than IF, such as at RF or at baseband, and/or in the analog domain.

The present invention may be implemented in the context of wireless signals transmitted from a base station to one or more mobile units of a wireless communication network. In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An amplifier circuit adapted to generate a linearized amplified output signal from an input signal, the amplifier circuit comprising:
    a main channel adapted to receive the input signal and generate an amplified main channel signal using a main amplifier operated in its non-linear region;
    an auxiliary channel adapted to apply the input signal to a model of the main amplifier to generate an auxiliary channel signal; and
    a summation node adapted to combine the amplified main channel signal and the auxiliary channel signal to generate the linearized amplified output signal, wherein the auxiliary channel further comprises:
        an auxiliary summation node adapted to generate an error signal based on a difference between the input signal and the output of the main amplifier model; and
        an auxiliary amplifier adapted to amplify the error signal to generate the auxiliary channel signal.

2. The invention of claim 1, wherein the auxiliary amplifier is operated in its linear region.

3. The invention of claim 1, wherein the power level of the auxiliary amplifier is less than the power level of the main amplifier.

4. The invention of claim 1, wherein the amplified main channel signal is not applied directly to the main amplifier model in generating the auxiliary channel signal.

5. The invention of claim 1, wherein the amplifier circuit is implemented without any high-power delay modules.

6. The invention of claim 1, wherein the amplifier circuit is implemented without any delay module between the output of the main amplifier and the summation node.

7. The invention of claim 1, further comprising a feedback control channel adapted to generate one or more control signals for controlling operations of one or more components in the main and auxiliary channels.

8. The invention of claim 1, wherein the main channel further comprises a pre-distorter adapted to pre-distort the input signal prior to application to the main amplifier.

9. The invention of claim 1, wherein:
    the main channel further comprises a main equalizer adapted to equalize the main channel signal prior to application to the main amplifier; and
    the auxiliary channel further comprises an auxiliary equalizer adapted to equalize the error signal, wherein the auxiliary amplifier is adapted to amplify the equalized error signal to generate the auxiliary channel signal.

10. The invention of claim 9, wherein the main channel further comprises a pre-distorter adapted to pre-distort the input signal prior to application to the main equalizer.

11. The invention of claim 9, wherein the auxiliary amplifier is operated in its linear region.

12. The invention of claim 9, wherein the power level of the auxiliary amplifier is less than the power level of the main amplifier.

13. The invention of claim 9, wherein the main and auxiliary equalizers compensate for phase, amplitude, and delay differences between the main and auxiliary channels.

14. The invention of claim 9, further comprising a feed-back control channel adapted to generate one or more control signals for controlling operations of one or more of the main equalizer, the main amplifier model, the auxiliary equalizer, and the auxiliary amplifier.

15. The invention of claim 14, wherein the feed-back control channel comprises:

a switch block adapted to select one or more signals for use in generating the control signals; and a control algorithm block adapted to generate the one or more control signals from the one or more selected signals.

16. The invention of claim 15, wherein the switch block is adapted to receive and select one or more of (1) the signal input to the main amplifier, (2) the amplified main channel signal output from the main amplifier, (3) the signal input to the auxiliary amplifier, (4) the auxiliary channel signal output from the auxiliary amplifier, and (5) the linearized amplified output signal from the summation node.

17. The invention of claim 9, wherein the main equalizer, the main amplifier model, and the auxiliary equalizer are adapted to operate in a digital domain.

18. The invention of claim 17, wherein:

the amplifier circuit further comprises an analog-to-digital converter (ADC) adapted to digitize an analog input signal for processing by the main and auxiliary channels;

the main channel further comprises a main digital-to-analog converter (DAC) adapted to convert the output of the main equalizer to an analog domain prior to application to the main amplifier; and the auxiliary channel further comprises an auxiliary DAC adapted to convert the output of the auxiliary equalizer to the analog domain prior to application to the auxiliary amplifier.

19. The invention of claim 18, wherein:

the amplifier circuit further comprises an RF/IF (radio frequency to intermediate frequency) converter adapted to convert an analog RF input signal into an analog IF input signal prior to application to the ADC;

the main channel further comprises a main IF/RF converter adapted to convert the output of the main DAC from IF to RF prior to application to the main amplifier; and the auxiliary channel further comprises an auxiliary IF/RF converter adapted to convert the output of the auxiliary DAC from IF to RF prior to application to the auxiliary amplifier.

20. A method for generating a linearized amplified output signal from an input signal, the method comprising:

generating an amplified main channel signal based on the input signal using a main amplifier operating in its non-linear region;

generating an auxiliary channel signal based on the input signal using a model of the main amplifier; and combining the amplified main channel signal and the auxiliary channel signal to generate the linearized amplified output signal, wherein generating the auxiliary channel further comprises:

generating an error signal based on a difference between the input signal and the output of the main amplifier model; and amplifying the error signal using an auxiliary amplifier to generate the auxiliary channel signal.

21. The invention of claim 20, wherein the auxiliary amplifier is operated in its linear region.

22. The invention of claim 20, wherein the power level of the auxiliary amplifier is less than the power level of the main amplifier.

23. The invention of claim 20, wherein the amplified main channel signal is not applied directly to the main amplifier model in generating the auxiliary channel signal.

24. The invention of claim 20, wherein the method is implemented without any high-power delay modules.

25. The invention of claim 20, wherein the method is implemented without any delay module between the output of the main amplifier and a summation node that combines the amplified main channel signal and the auxiliary channel signal.

26. The invention of claim 20, further comprising generating one or more control signals for controlling operations of one or more components in the main and auxiliary channels.

27. The invention of claim 20, wherein generating the amplified main channel signal comprises pre-distorting the input signal prior to application to the main amplifier.

28. The invention of claim 20, wherein:

generating the amplified main channel signal further comprises equalizing the main channel signal prior to application to the main amplifier; and generating the auxiliary channel signal further comprises equalizing the error signal, wherein the equalized error signal is amplified using the auxiliary amplifier to generate the auxiliary channel signal.

29. The invention of claim 28, wherein generating the amplified main channel signals further comprises pre-distorting the input signal prior to equalizing.

30. The invention of claim 28, wherein the auxiliary amplifier is operated in its linear region.

31. The invention of claim 28, wherein the power level of the auxiliary amplifier is less than the power level of the main amplifier.

32. The invention of claim 28, wherein equalizing the main channel signal and the error signal compensates for phase, amplitude, and delay differences between the main and auxiliary channels.

33. The invention of claim 28, further comprising generating one or more control signals for controlling operations of one or more of a main equalizer, the main amplifier model, an auxiliary equalizer, and the auxiliary amplifier.

34. The invention of claim 33, wherein generating the one or more control signals comprises:

selecting one or more signals for use in generating the control signals; and generating the one or more control signals from the one or more selected signals.

35. The invention of claim 34, wherein selecting the one or more signals comprises receiving and selecting one or more of (1) the signal input to the main amplifier, (2) the amplified main channel signal output from the main amplifier, (3) the signal input to the auxiliary amplifier, (4) the auxiliary channel signal output from the auxiliary amplifier, and (5) the linearized amplified output signal from a summation node that combines the amplified main channel signal and the auxiliary channel signal.

36. The invention of claim 28, wherein a main equalizer, the main amplifier model, and an auxiliary equalizer are adapted to operate in a digital domain.

37. The invention of claim 36, further comprising:

digitizing, using an ADC, an analog input signal for processing by the main and auxiliary channels;

converting, using a main DAC, the output of the main equalizer to an analog domain prior to application to the main amplifier; and converting, using an auxiliary DAC, the output of the auxiliary equalizer to the analog domain prior to application to the auxiliary amplifier.

38. The invention of claim 37, further comprising:

converting an analog RF input signal into an analog IF input signal prior to application to the ADC;

converting the output of the main DAC from IF to RF prior to application to the main amplifier; and converting the output of the auxiliary DAC from IF to RF prior to application to the auxiliary amplifier.

39. An apparatus for generating a linearized amplified output signal from an input signal, the apparatus comprising:

means for generating an amplified main channel signal based on the input signal using a main amplifier operating in its non-linear region;

means for generating an auxiliary channel signal based on the input signal using a model of the main amplifier; and means for combining the amplified main channel signal and the auxiliary channel signal to generate the linearized amplified output signal, wherein the means for generating the auxiliary channel signal comprises:

means for generating an error signal based on a difference between the input signal and the output of the main amplifier model; and means for amplifying the error signal to generate the auxiliary channel signal.

40. An amplifier circuit adapted to generate a linearized amplified output signal from an input signal, the amplifier circuit comprising:

a main channel adapted to receive the input signal and generate an amplified main channel signal using a main amplifier operated in its non-linear region;

an auxiliary channel adapted to apply the input signal to a model of the main amplifier to generate an auxiliary channel signal; and a summation node adapted to combine the amplified main channel signal and the auxiliary channel signal to generate the linearized amplified output signal, wherein the amplified main channel signal is not applied directly to the main amplifier model in generating the auxiliary channel signal.

41. An amplifier circuit adapted to generate a linearized amplified output signal from an input signal, the amplifier circuit comprising:

a main channel adapted to receive the input signal and generate an amplified main channel signal using a main amplifier operated in its non-linear region;

an auxiliary channel adapted to apply the input signal to a model of the main amplifier to generate an auxiliary channel signal;

a summation node adapted to combine the amplified main channel signal and the auxiliary channel signal to generate the linearized amplified output signal; and a feed-back control channel adapted to generate one or more control signals for controlling operations of one or more components in the main and auxiliary channels.

42. An amplifier circuit adapted to generate a linearized amplified output signal from an input signal, the amplifier circuit comprising:

a main channel adapted to receive the input signal and generate an amplified main channel signal using a main amplifier operated in its non-linear region;

an auxiliary channel adapted to apply the input signal to a model of the main amplifier to generate an auxiliary channel signal, wherein the main amplifier model models distortion of the main amplifier without generating an amplified signal; and a summation node adapted to combine the amplified main channel signal and the auxiliary channel signal to generate the linearized amplified output signal.

43. An amplifier circuit adapted to generate a linearized amplified output signal from an input signal, the amplifier circuit comprising:

a main channel adapted to receive the input signal and generate an analog amplified main channel signal using an analog main amplifier operated in its non-linear region;

an auxiliary channel adapted to apply the input signal to a digital model of the analog main amplifier to generate an auxiliary channel signal, wherein the digital model models, in a digital domain, distortion of the analog main amplifier; and a summation node adapted to combine the amplified main channel signal and the auxiliary channel signal to generate the linearized amplified output signal.

44. The invention of claim 43, wherein the digital model models the distortion of the analog main amplifier without generating an amplified analog signal.

* * * * *